US 12,051,940 B2
Jul. 30, 2024

(12) United States Patent
Kim et al.

(54) TIMING DETERMINATION FOR UPS POWER TRANSFER

(71) Applicant: Google LLC, Mountain View, CA (US)

(72) Inventors: Sangsun Kim, San Jose, CA (US); Krishnanjan Gubba Ravikumar, Pullman, WA (US)

(73) Assignee: Google LLC, Mountain View, CA (US)

(*) Notice: Subject to any disclaimer, the term of this patent is extended or adjusted under 35 U.S.C. 154(b) by 34 days.

(21) Appl. No.: 18/078,573

(22) Filed: Dec. 9, 2022

(65) Prior Publication Data

US 2024/0195212 A1   Jun. 13, 2024

(51) Int. Cl.
*H02J 9/06* (2006.01)
*G01R 19/02* (2006.01)
*H02J 3/00* (2006.01)

(52) U.S. Cl.
CPC ........... *H02J 9/062* (2013.01); *G01R 19/02* (2013.01); *H02J 3/0012* (2020.01)

(58) Field of Classification Search
CPC .......... H02J 9/062; H02J 3/0012; G01R 19/02
See application file for complete search history.

(56) References Cited

U.S. PATENT DOCUMENTS

| 5,579,197 | A | 11/1996 | Mengelt et al. |
| 8,810,273 | B1 | 8/2014 | Kim et al. |
| 9,225,202 | B1 | 12/2015 | Kim et al. |
| 10,020,737 | B1 | 7/2018 | Humphrey et al. |
| 11,616,388 | B1* | 3/2023 | Chen .................... H02J 7/0031 |
| | | | 307/64 |
| 2006/0078773 | A1 | 4/2006 | Speranza et al. |
| 2013/0002024 | A1 | 1/2013 | Beg et al. |
| 2014/0021789 | A1 | 1/2014 | Greer et al. |
| 2014/0062201 | A1* | 3/2014 | Giuntini ............ G01R 19/2513 |
| | | | 307/64 |
| 2014/0139022 | A1* | 5/2014 | Bush ...................... H02M 5/40 |
| | | | 307/31 |
| 2016/0276870 | A1* | 9/2016 | Olsen ...................... H02M 3/04 |
| 2022/0393505 | A1* | 12/2022 | Marzano ................. H02J 7/345 |

OTHER PUBLICATIONS

Extended European Search Report for European Patent Application No. 23174439.2 dated Nov. 24, 2023. 6 pages.

* cited by examiner

*Primary Examiner* — Jared Fureman
*Assistant Examiner* — Duc M Pham
(74) *Attorney, Agent, or Firm* — Lerner David LLP

(57) ABSTRACT

Disclosed are devices, systems, and methods for operating a backup power source or an uninterruptible power supply (UPS) that can be used in data centers and that provide a backup power source to power the data center when utility power is compromised. A power delivery system that provides power to a primary system may include a UPS with a state timing control system that operates a bypass static switch. The state timing control system can determine when to transition the primary system from the utility power supply to the backup UPS, based on the current AC voltage conditions. The state timing control system may perform modeling to emulate the intermediate DC voltage of an actual rectifier, and particularly emulate the holdup capacitor voltage. The emulated capacitor voltage can be obtained in real time by both an input power model based on RMS utility voltage and the actual rectifier output load.

20 Claims, 13 Drawing Sheets

150

154

160

192

250

260

268

TIMING DETERMINATION FOR UPS POWER TRANSFER

BACKGROUND

Utility alternating current (AC) power is converted to direct current (DC) power or voltage source(s) in data centers to feed electric loads. These loads may take the form of servers and other equipment or devices that provide the services supported by a data center. Rectifiers are used to convert the AC power to DC power and, in some systems, they are configured to maintain power to the loads for short periods of time (e.g., holdup time) during power abnormalities and prior to transitioning a system to a backup power source. As such, the loads may operate uninterrupted within short time periods (e.g., half AC cycle) if such time periods are within the holdup time. Improved systems and methods are needed for determining the timing for transition from utility AC power to a backup power source.

SUMMARY

According to an aspect of the disclosure, a system comprises a switch, a rectifier, and a control element. The switch may couple a load to an alternating current (AC) source or a backup power source. The rectifier may couple the load to the AC source or the backup power source. The control element may be coupled to the switch so as to control which of the AC source or the backup power source is coupled to the load. The control element comprises an emulation module that determines when a signal should be applied to the switch such that the backup power source supplies power to the load based on a comparison of a threshold voltage to an emulated capacitor holdup voltage. The emulated capacitor holdup voltage may be determined based on a root mean square (RMS) voltage value associated with the AC source.

According to another aspect of the disclosure, a method for selecting between an alternating current (AC) source and an uninterruptible power supply (UPS) for a system, comprises obtaining an instantaneous root mean square (RMS) voltage of the system based on an alternating current (AC) source; determining, by a computing device, an emulated capacitor holdup voltage based on the instantaneous RMS voltage; and comparing the emulated holdup capacitor voltage to a pre-determined threshold voltage. The emulated capacitor holdup voltage is less than the pre-determined threshold voltage, switching the power supplied to the system so that it is supplied by the UPS.

According to an aspect of the disclosure, a method for selecting between an alternating current (AC) source and a backup power source of an uninterruptible power supply (UPS) for a system comprises obtaining an instantaneous root mean square (RMS) voltage of the system based on an alternating current (AC) source; determining, by a computing device, an emulated capacitor holdup voltage based on an instantaneous RMS voltage; comparing the emulated holdup capacitor voltage to a pre-determined threshold voltage; and transitioning the backup power source based on the comparison between the emulated capacitor holdup voltage and the pre-determined threshold voltage.

DESCRIPTION OF THE DRAWINGS

A more complete appreciation of the subject matter of the present technology may be realized by reference to the following detailed description which refers to the accompanying drawings, in which.

DETAILED DESCRIPTION

Figure 1A:
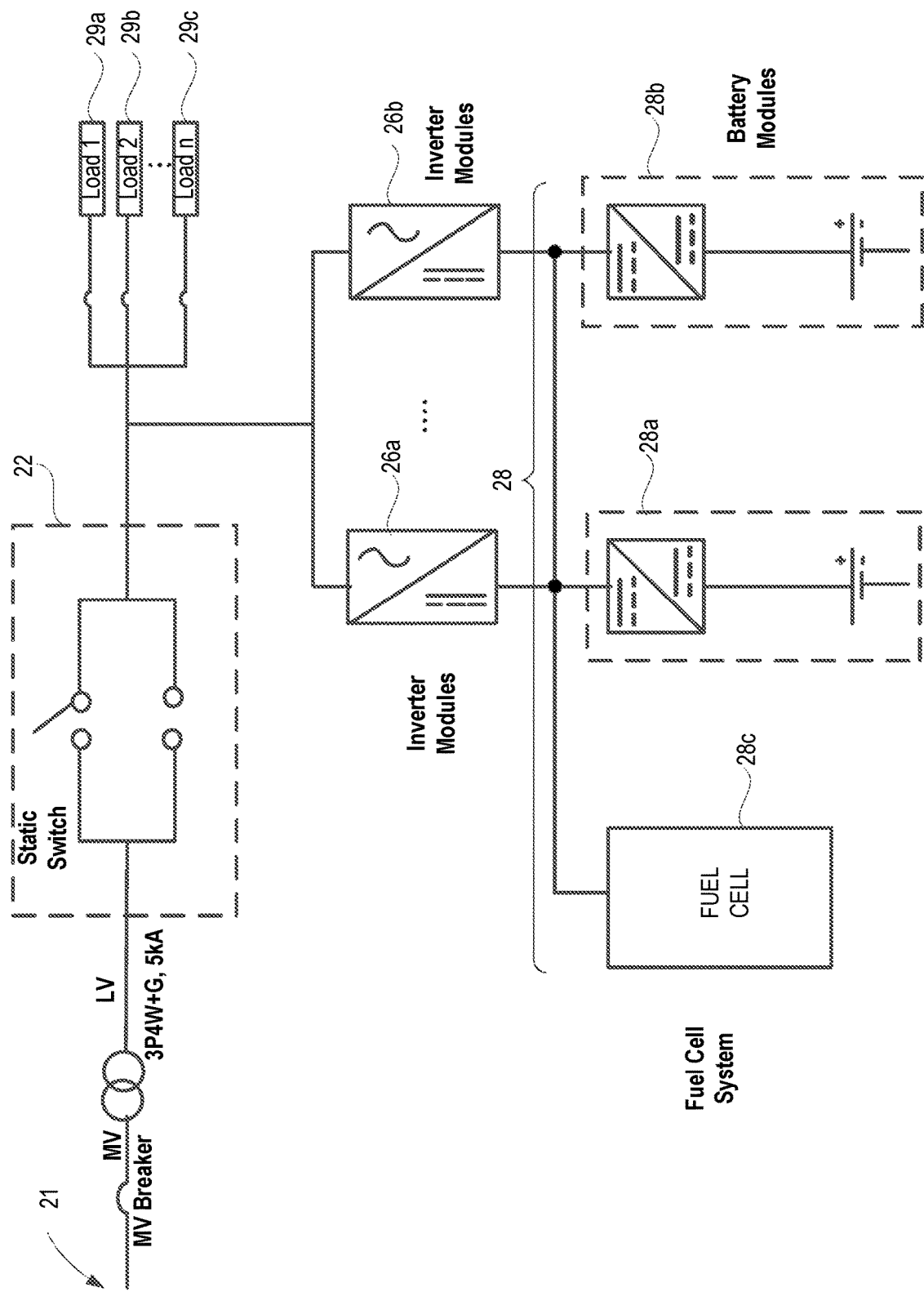
FIG. 1A is an example system in accordance with aspects of the disclosure.

The present disclosure relates to methods and systems that can be used to mitigate against power interruptions that may occur on a power or voltage supply line that is supplying power to a load (e.g., equipment or devices). Such power interruptions may occur on a main power source (e.g., utility AC power) resulting in a switch to a backup power source (e.g., an uninterruptible power supply (UPS)). The disclosed technology may be used to control the timing of (e.g., delay) when a switch to backup power may be required.

Traditional UPSs (e.g. double conversion UPS) used for backup power sources are very reliable, but power efficiency is sacrificed. Given the fluctuations in the power supply, it is difficult to determine with accuracy the optimal time to make the switch to the UPS. To account for all possibilities and avoid data loss, UPS systems routinely transfer loads to the backup supply within a few microseconds following a power disturbance. While the automatic UPS transfer achieved with the traditional UPS provides greater reliability in ensuring that the UPS will take over and no data or systems will be compromised due to lack of power, there are drawbacks to the efficiency of such UPS backup systems. Use of a line interactive UPS, instead of a double conversion UPS or other UPS, can significantly improve the power efficiency, but its frequent switching over to the backup power source may make the system less reliable. When the time period to switch over to the UPS is too short, numerous transitions to backup power will occur, given that short-term utility AC voltage disturbances are typically not uncommon. This degrades the availability of datacenter loads and causes an excess of backup power operations due to shorter time duration power events occurring, all of which affects datacenter availability. According to aspects of the disclosure, by delaying the power transfer, high power efficiency and/or better reliability with the line interactive UPS may be achieved.

According to aspects of the disclosure, a power delivery system that provides power to a primary system, such as a data center, data rack, or an individual device or equipment, may include a state timing control system. The state timing control system may be used to control a bypass static switch, e.g., turn it on and off, so as to control the transition to and from an UPS. The state timing control system can determine a time to delay, for as long as practical, the transition from the utility power supply to the backup UPS, based on current AC voltage or current conditions. As will be explained in more detail below, in some examples, the voltage on a main AC power source may be monitored and used in determining a more accurate holdup voltage associated with the rectifier circuits associated with the loads. The holdup voltage may then be compared to a threshold system voltage of the primary system to determine whether a switch to the backup system should be initiated. A more accurate determination of the holdup voltage may, in turn, lead to a longer holdup time (i.e., a determination that the time when the holdup voltage reaches a threshold voltage is delayed). In some examples, a threshold system voltage is based on the voltage capacity of the actual rectifiers in the system. In some examples, a percentage of a normal (or steady state) voltage in the rectifier may be selected as the threshold voltage. For example, a threshold voltage may be pre-determined to be 70-85 percent of a normal (or steady state) voltage in the rectifier, although the threshold voltage can be set at any desired threshold voltage.

Recognizing that an intermediate DC voltage of a rectifier provides a voltage that maintains the actual output of the rectifier, according to an aspect of the disclosure, the state timing control system may include a model to emulate the intermediate DC voltage of a rectifier, and particularly emulate the holdup capacitor voltage associated with the rectifier. In some examples, the intermediate DC voltage of a "worst case" rectifier that is highly loaded may be emulated. The "worst case" rectifier may, for example, result when all devices connected to a rack are drawing a large amount of power simultaneously.

To determine the intermediate DC voltage or the holdup capacitor voltage of one of the numerous rectifiers in a system, the actual holdup capacitor voltages for each of the actual rectifiers in the system do not need to be determined. Specifically, the holdup capacitor may be modeled as the sum of the individual holdup capacitors associated with the rectifier circuits (e.g., the rectifier circuits are considered parallel circuits). As such, the incoming utility AC voltage may be monitored and evaluated to approximate or emulate the actual capacitor holdup voltage of all the rectifier circuits. In some examples, a real time magnitude, and more particularly an instantaneous root mean square (RMS) voltage may be determined from the incoming utility AC voltage that functions as the main power source. The monitoring and determination can be made by the state timing control system, which, in some examples, may include an RMS module and an emulation module. The emulated holdup capacitor voltage is expected to roughly track the actual utility AC voltage, which in effect provides a more accurate determination of the emulated holdup capacitor voltage and, thus, holdup time. This, in turn, is sufficient to determine the right timing for power transfer based on the threshold voltage. More specifically, once an emulated holdup capacitor voltage is determined, the state timing control system can compare the emulated holdup capacitor voltage to the predetermined threshold voltage, and particularly whether the emulated holdup capacitor voltage is being maintained above the pre-determined threshold voltage. As long as the emulated capacitor voltage is maintained above the threshold, the primary system loads can be maintained without any power interruptions caused by various utility disturbances. When the emulated holdup capacitance voltage falls below the threshold system voltage, the state timing control system can turn off the bypass switch (e.g., open the switch) and transition a data center or a rack from utility AC power to a backup power source of the UPS.

Example Systems

FIG. 1A illustrates an example UPS system 20 that can provide backup power to a primary system, downstream components or more generally loads, such as a data center, a data center rack, equipment, devices, or any system requiring power. System 20 may comprise a single power domain that covers the loads under a medium voltage (MV) breaker. The system 20 may comprise a line interactive type UPS system which is more efficient and cheaper than traditional online double conversion UPS systems and, in some examples, may be directly installed on a low voltage (LV) line of MV-to-LV transformer secondary side. Although system 20 is shown as only one UPS system, multiple UPS systems may be combined on an MV power plane.

The UPS system 20 is illustrated as including an AC source 21, a static switch 22, and loads 29a, 29b, 29c.

The UPS system 20 can include one or more inverter modules 26a, 26b, and one backup power system 28, although other backup power systems may be added to the configuration. The backup power system includes a fuel cell 28c and may, as an option, include battery modules 28a, 28b. Additionally, the fuel cell 28c and the battery modules 28a, 28b may be optionally connected to one another. The inverter modules 26a, 26b convert the DC voltages provided by either the fuel cell or batteries into an AC voltage or source that is supplied to loads 29a, 29b, 29c.

The static switch 22 turns the UPS system 20 on and off. When the bypass static switch 22 is turned on and the switch is closed, utility AC voltage will provide power to the primary system or loads 29a, 29b, 29c. When the bypass static switch 22 is turned off and the switch is open, the UPS system 20 is operational and the backup power source 28 supplies power to loads 29a, 29b, 29c.

During operation, the UPS 20 may feed at least three loads 29a, 29b, 29c. Each of the loads 29a, 29b, 29c may comprise any desired voltage. The voltage or amps of the loads 29a, 29b, 29c may be the same, or in some examples one or more of the loads 29a, 29b, 29c may differ from one another. Additionally, there may be more than or less than three loads.

Figure 1B:
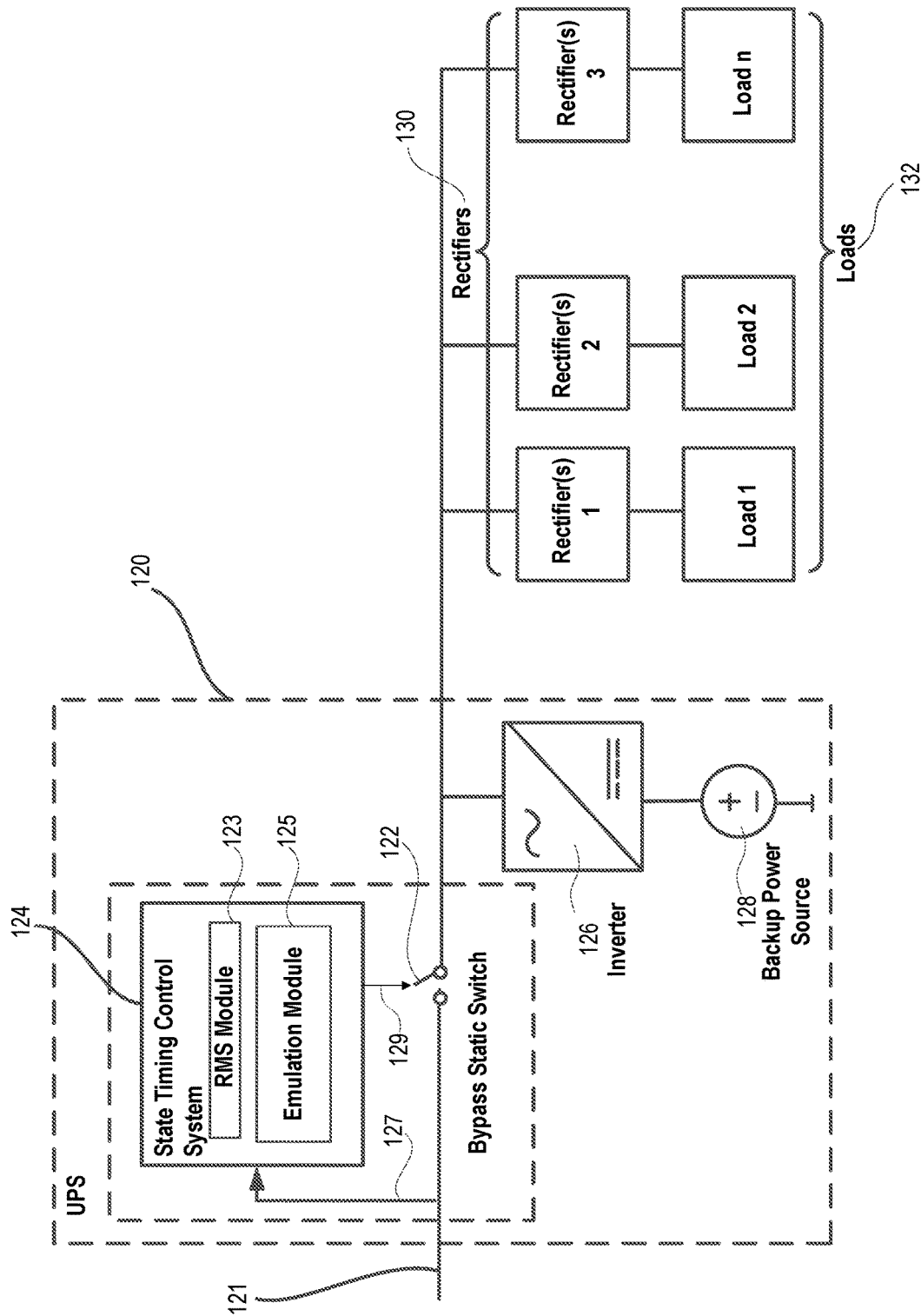
FIG. 1B is an example power system in accordance with aspects of the disclosure.

FIG. 1B illustrates an example of a system 100. The system 100 includes a centralized UPS 120 coupled to an AC power source 121. The UPS 120 comprises a bypass static switch 122 that can be controlled by a state timing control system 124, and an inverter 126 coupled to a backup power source 128. Inverter 126 functions to convert the DC power it receives from power source 128 into AC power signals. The state timing control system 124 comprises RMS module 123 and emulation module 125 and receives as input a signal 127 associated with the AC power source 121. The state timing control system 124 outputs a signal 129 that controls the operation of bypass switch 122. The UPS 120 along with rectifiers 130 operate to supply power to loads 132 when an AC power source 121 becomes compromised or unavailable. Rectifiers 130 also function to supply the loads 132 when an AC power source is coupled to them. The state timing control system 124 is shown as part of the UPS 120, but in other examples, it may be provided separate from the UPS.

The loads 132 may be considered a primary system that requires power to perform its functions. In one example, a data center may be considered a primary system. In other examples, the primary system may comprise a rack of equipment, equipment, or a device. With regard to a computing system, the equipment or devices may comprise servers, switches, routers, or, more generally, computing and communications equipment or devices. The primary system may, however, comprise any system, equipment, or device that draws power and acts as a load.

Rectifiers 130 function to convert the AC power provided via UPS 120 or AC source 121 to a DC voltage acceptable by the load coupled to the rectifier. Typically, such DC voltage will be lower than the AC voltage coupled to the rectifier by either UPS 120 or AC source 121. Although not shown, the system 100 can include thousands of rectifiers 130 that will assist with maintaining the power loads of the primary system during power disturbances. In some examples, the rectifiers may be co-located with the load, e.g., installed in the rack that is housing the equipment. In other examples, the rectifiers may be part of the UPS system.

AC disturbances, such as voltage sags and swells and overvoltage transients, occur in single, two, or three phase utility AC lines, causing abnormal power supply to the loads, e.g., to a data center. To accommodate these disturbances during normal operation, the rectifiers 130 are configured to provide a holdup time inside of the rectifiers 130 to maintain power or voltage to the load or primary system for a short time (e.g., a half AC cycle, 10 ms, etc.).

Operation of the UPS 120 can be controlled by a bypass static switch 122 that opens and closes depending on whether a backup power source is required. When the bypass switch 122 is on and the switch is closed, utility conditions are normal. As such, the power delivery will bypass the UPS 120, and utility AC voltage operates to supply the load and power the devices in the primary system, e.g., devices operating off the DC power rails. When there is an AC voltage disturbance, the bypass switch 122 can be turned off and the switch opened so that the UPS 120 powers the primary system via inverter 126 and backup power source 128.

According to aspects of the disclosure, the state timing control system 124 can determine the timing requirements for bypass switch 122, so as to avoid problems associated with the line interactive UPS systems, such as system degradation due to repeated unnecessary switching and/or premature switching between utility AC power and UPS backup power.

More specifically, RMS module 123 of the state timing control system 124 can monitor and/or determine an instantaneous RMS voltage. In particular, in some examples, the RMS module 123 may receive a real-time AC voltage information (e.g., just monitor), while in other examples it may receive a real-time AC voltage information that can be used to receive utility AC voltages and calculate the instantaneous RMS voltage (e.g., monitor and determine). In examples where the RMS voltage and other information related to the AC source is supplied to the state timing control system 124, the RMS module may not be needed and such information can be supplied to the emulation module 125. As such, in some examples, the RMS system is a part of the state timing control system 124, but in other examples, the RMS module 123 may be part of a different system that can communicate information about the RMS voltage of the utility AC power to the state timing control system 124. The RMS module 123 may provide an instantaneous RMS voltage of incoming utility AC power in real time. This information can be communicated to other modules in the state timing control system 124, such as the emulation module 125, which may then determine when to switch to UPS power.

The emulation module 125 of the state timing control system 124 can receive data from the RMS module 123 indicating an RMS voltage associated with the AC source. In some examples, the RMS voltage may comprise a real-time or almost real-time RMS voltage of the incoming AC utility power. The RMS voltage may then be used by the emulation module 125 to determine whether an emulated holdup voltage representing the holdup voltage of the rectifier(s) is above or below a threshold value. As such, the emulation module 125 may determine when a power abnormality or line fault cannot be upheld by rectifiers and therefore the bypass switch 122 should be opened so that the UPS 120 supplies power to the loads. As is explained in further detail below, because the RMS voltage may be used to determine a holdup voltage associated with the rectifier(s), the holdup voltage level may be tracked more accurately and almost instantaneously. For example, as the RMS voltage drops, the holdup level may drop, but may rise thereafter if the RMS voltage rises. This, in turn, may delay the time of when the holdup voltage approaches a threshold level (i.e., a voltage level at which it can no longer sustain the load).

Figure 2:
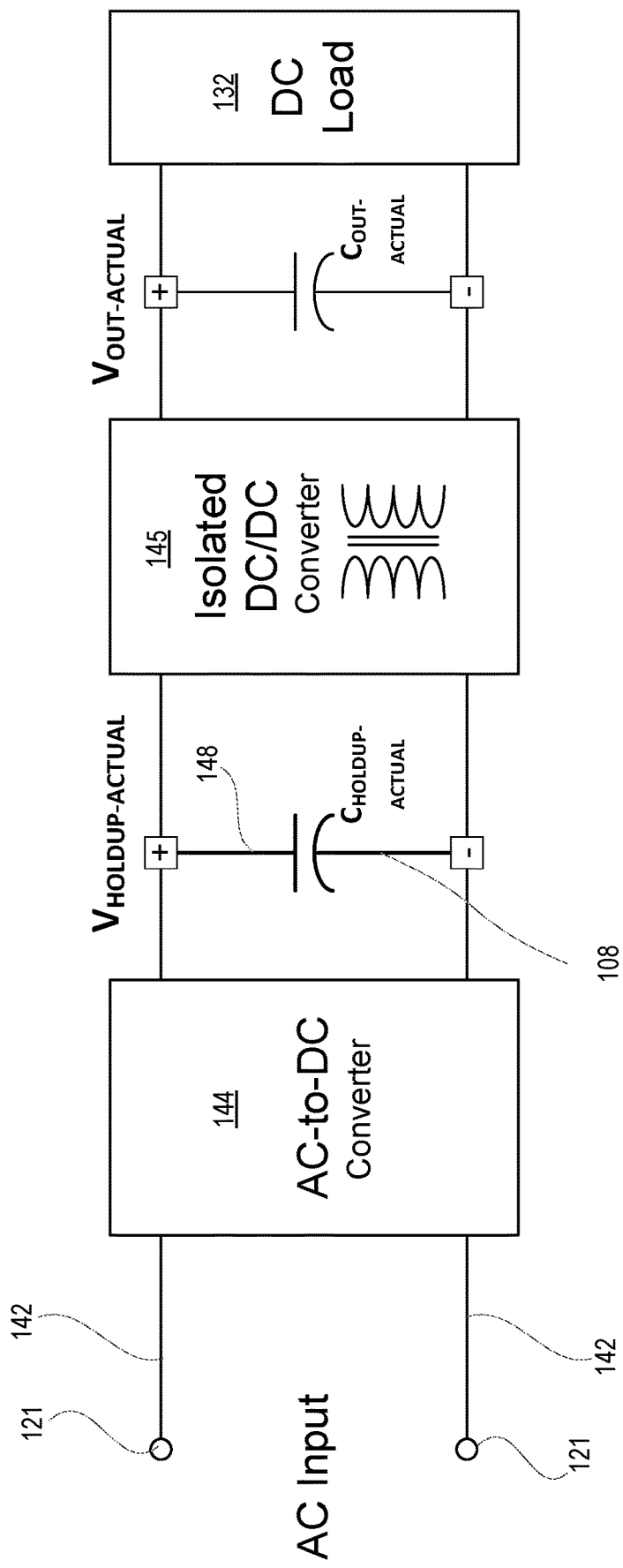
FIG. 2 is an example rectifier circuit in accordance with aspects of the disclosure.

FIG. 2 illustrates a schematic example of a simplified rectifier circuit 140 of one of the rectifiers 130 of system 100. The rectifier circuit 140 includes AC line(s) 142 coupled to inputs that receive AC source(s) 121. The AC source 121 voltage is fed to AC-to-DC converter 144. A holdup capacitor $C_{HOLDUP-ACTUAL}$ is connected across the DC output of the converter 144. The holdup capacitor $C_{HOLDUP-ACTUAL}$ stores energy during normal utility AC power operation that can supply the load 132. The energy stored in $C_{HOLDUP-ACTUAL}$ IS proportional to $V_{HOLDUP-ACTUAL} \times V_{HOLDUP-ACTUAL}$ and prevents the loads 132 from being interrupted and prematurely switching to UPS power when there is an AC power interruption for a short time period.

The rectifier circuit 140 also includes a DC/DC converter 145 coupled across the holdup capacitor. The DC/DC converter 145 may convert the voltage from the AC-to-DC converter 144 to a different voltage level (e.g., VOUT-ACTUAL) suitable for the load 132. The voltage at the load 132 will typically be lower than the voltage from the AC-to-DC converter 144, e.g., DC/DC converter 145 operates as a step-down power conversion via an isolated transformer. Converters 144 and 145 may comprise any converters that perform the equivalent functions.

During normal operations, when needed, current from AC source 121 is applied to the rectifier 140 through AC line 142. As discussed above, there are typically two power or voltage conversion steps in the rectifier. A first conversion takes place at converter 144 converting an AC voltage to an intermediate DC voltage and converter 145 may convert the DC voltage to a lower voltage DC via galvanic isolation. Holdup capacitor $C_{HOLDUP-ACTUAL}$ holds the holdup capacitor voltage $V_{HOLDUP-ACTUAL}$ above a pre-determined rectifier voltage level so that the output voltage (low voltage DC) VOUT-ACTUAL is maintained by the output capacitor COUT-ACTUAL for the load 132. In this way, the load 132 may operate without experiencing any low voltage DC power interruptions.

Figure 3:
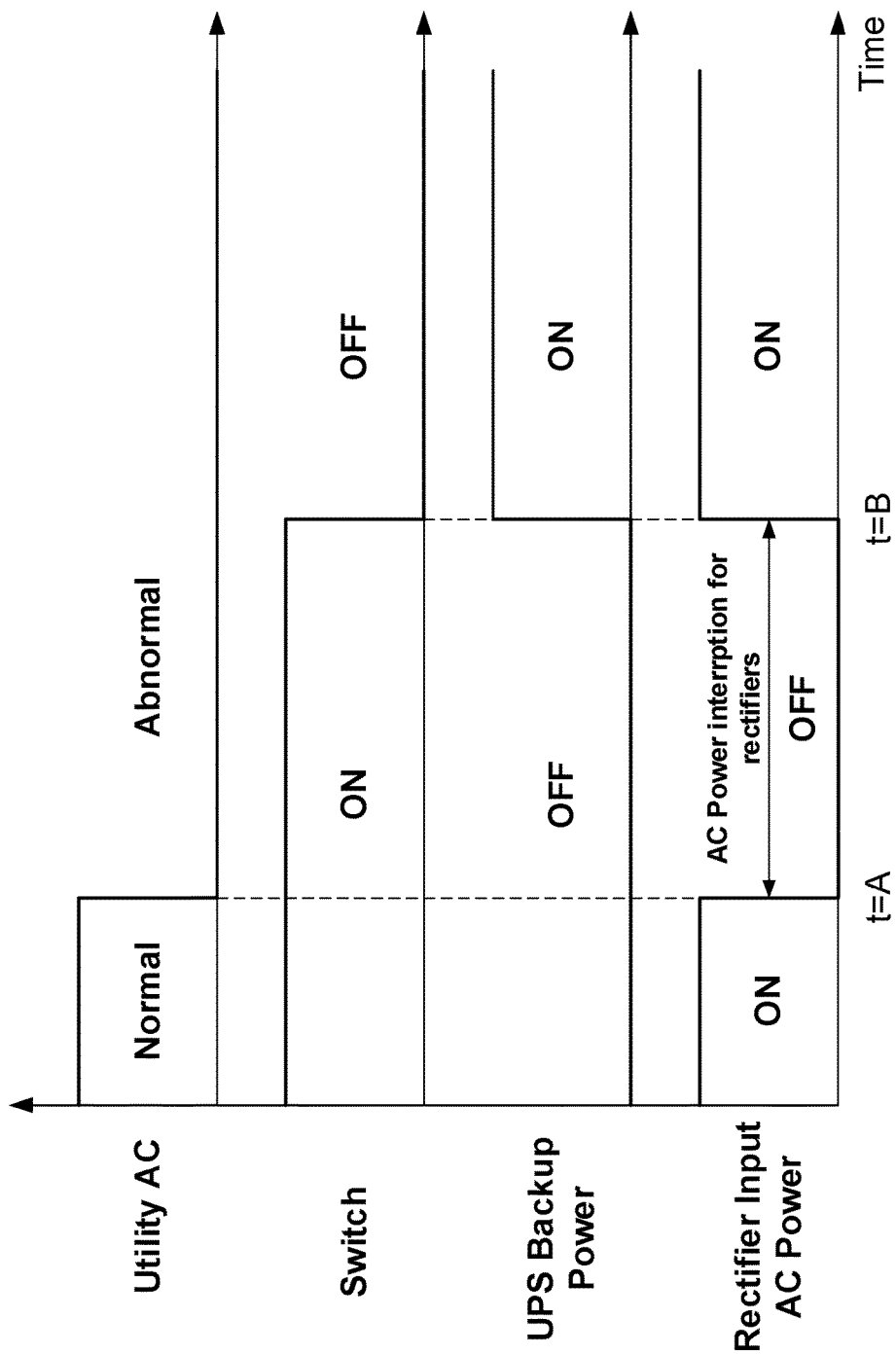
FIG. 3 illustrates an example timing diagram illustrating transitioning to backup power in accordance with aspects of the disclosure.

FIG. 3 shows an example of a timing sequence 150 to illustrate a possible timing transition from an AC source to an UPS. At t=A, utility AC voltage becomes abnormal. However, the static bypass switch remains "on" (e.g., closed) so as to bypass the UPS (e.g., UPS 120). At t=A, input AC power to the rectifier is also interrupted. The rectifiers, however, will hold a pre-determined threshold voltage or power level (and maintain the load) while the holdup capacitors $C_{HOLDUP-ACTUAL}$ (see FIG. 2) remain sufficiently charged. At t=B, the rectifiers can no longer maintain the load and the static switch is turned off (e.g., opened) and the system switches to backup power operation.

According to aspects of the disclosure, the components of the rectifier can be emulated by the emulation module 125 of the state timing control system 124 to provide the best time t=B, in which the power delivery system 100 should transition from utility AC voltage to the UPS backup power source 128. When there is an AC voltage sag, swell, or other disturbance, the state timing control system 124 may determine that there is a voltage disruption or abnormality based on the RMS voltage provided by the RMS module 123. According to an aspect of the disclosure, the emulation module 125 can emulate the holdup capacitor for the loads (or primary system) to determine when it is necessary to transfer the primary system from AC utility voltage to an UPS power source. In one example, the emulation module 125 determines an emulated holdup capacitor voltage $V_{HOLDUP-EMULATED}$.

Figure 4:
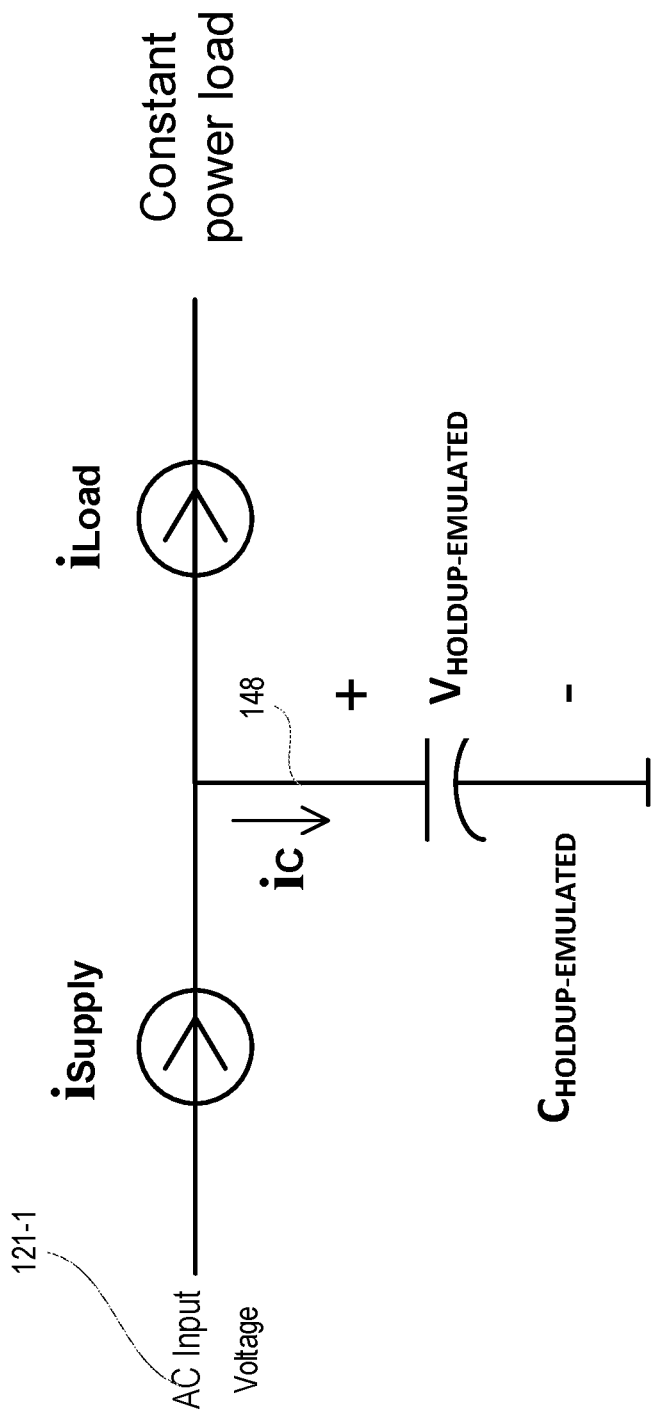
FIG. 4 is an example of a model of an emulated holdup capacitor circuit in accordance with aspects of the disclosure.

FIG. 4 illustrates an example of a circuit diagram 152 that models an emulated holdup capacitor. In some examples, the model may be configured to emulate a worst-case rectifier among a group of rectifiers. For example, if it is determined that a particular rack of equipment in a data center comprises the largest load in the system, the emulation module 125 may use the holdup voltage associated with that load as the model for the primary system behavior. In other examples, the model may be configured to monitor the load of individual rectifiers, or a group of rectifiers or all the rectifiers coupled to an AC source.

As shown in FIG. 4, incoming utility AC input voltage is provided by an AC source. The supply current $i_{Supply}$ is equal to $i_C$ plus $i_{LOAD}$. $i_C$ is the current flowing into emulated holdup capacitor $C_{HOLDUP-EMULATED}$. $I_{LOAD}$ comprises the current flowing into the loads. If the values of $i_{Supply}$ and $i_{LOAD}$ can be accurately determined, e.g., known or estimated, then the value of $i_C$ may then be determined given the relationship between $i_{Supply}$, $i_C$, and $i_{LOAD}$. The values of $i_C$, and $C_{HOLDUP-EMULATED}$ may then be used to determine the emulated capacitor voltage, $V_{HOLDUP-EMULATED}$.

The emulated holdup capacitor voltage emulates the actual holdup capacitor voltage $V_{HOLDUP-ACTUAL}$. Recognizing that the actual holdup capacitor voltage $V_{HOLDUP-ACTUAL}$ of the rectifier can maintain the rectifier loads and power to the primary system during power disturbances, the emulation module 125 of the state timing control system 124 can emulate or predict the actual holdup capacitor voltage $V_{HOLDUP-ACTUAL}$. The emulation module 125 can use the emulated holdup voltage $V_{HOLDUP-EMULATED}$ of the emulated holdup capacitor to determine how long the emulated holdup capacitor voltage $V_{HOLDUP-EMULATED}$ can be maintained above a pre-determined threshold voltage while power to the primary system is abnormal. This can also provide the timing for when the primary system should transition from AC utility voltage to an UPS backup power source.

In some examples, the emulated holdup capacitor voltage $V_{HOLDUP-EMULATED}$ can emulate the holdup capacitor voltage of the worst-case rectifier with the highest load. However, there may be thousands of rectifiers in the power delivery system 100. This makes it difficult and otherwise impractical to monitor all holdup capacitor voltages to identify the worst-case rectifiers in the power delivery system 100.

According to an aspect of the disclosure, instead of monitoring the actual holdup capacitor voltages for each of the rectifiers in the power delivery system 100, the incoming utility AC voltage to the data center, or more generally the load(s), may be monitored to approximate or emulate the actual capacitor holdup voltage which powers the entire rectifier load. In particular, the emulated holdup capacitor voltage will roughly match or correlate with the actual utility AC voltage and particularly the instantaneous RMS voltage, which is sufficient to determine the right timing for power transfer based on the threshold voltage in the emulation module.

AC utility voltage to the data center is typically a three-phase AC voltage. In some examples, each phase of the three-phase AC utility voltage is evaluated. A preliminary emulated capacitor holdup voltage can be determined or provided for each of the three phases and assigned a preliminary emulated capacitor holdup voltage. The worst-case voltage may be the lowest of the preliminary emulated capacitor holdup voltages, which indicates that there are power fluctuations and reduced voltage or reduced power entering the system. The lowest voltage can then be selected by the emulation module 125 as the emulated capacitor holdup voltage $V_{HOLDUP-EMULATED}$. Thus, in some examples, the emulated holdup capacitor voltage $V_{HOLDUP-EMULATED}$ will be an emulation of the worst-case actual rectifier holdup capacitor voltage.

In some examples, the holdup capacitor voltage can be emulated based on 100% rectifier output load. In another example, where the individual rectifier loads are known, the capacitor voltage can be emulated based on the rectifier showing the highest load.

To determine the emulated holdup capacitor voltage of the emulated capacitor, the RMS module 123 may first determine the real time or instantaneous RMS voltage or magnitude of the utility AC voltage. As previously discussed, in place of determining such voltage, the RMS module 123 may receive the utility AC voltage from the system that supplies the AC source. As utilized herein, the terms "real-time"/"instantaneously" mean within a reasonable amount of time, taking into account the time needed for circuitry to perform its functions. The emulation module 125 may receive the instantaneous RMS voltage from the RMS module 123 and run modeling to provide a more accurate emulated holdup capacitor voltage, which in turn will help to determine the best time to transfer the system to an UPS power source. A more detailed discussion of how to determine instantaneous RMS voltage is discussed below.

The emulation module 125 can determine the emulated holdup capacitor voltage over time, as well as when to turn off the switch 122 so that UPS operations may commence. The following formulas can be used to determine the emulated holdup capacitor voltage over time:

$$i_{SUPPLY}(t) = \frac{\text{input power}}{V_{HOLDUP-EMULATED}} \qquad \text{Equation 1}$$

$$i_{LOAD}(t) = \frac{\text{output power}}{V_{HOLDUP-EMULATED}} \qquad \text{Equation 2}$$

$$i_C(t) = i_{SUPPLY} - i_{LOAD} \qquad \text{Equation 3}$$

$$V_{HOLDUP-EMULATED}(t+1) = \frac{1}{C_{HOLDUP-EMULATED}} \times \int i_C dt + V_{INITIAL} \qquad \text{Equation 4}$$

Equation 1

Equation 1 determines the supply current $i_{Supply}$ based on the relationship between the input power and the emulated capacitor holdup voltage $V_{HOLDUP-EMULATED}$. As noted above, the RMS module 123 of the state timing control system 124 can determine the instantaneous RMS voltage (as discussed below) for each of the three-phase AC voltages.

In one example, an RMS module 123 can provide the instantaneous utility RMS voltage, which can also help to provide the input power. In some examples, the RMS module 123 determines the instantaneous utility RMS voltage in real time and provides this information to the emulation module 125. Any method for determining instantaneous RMS voltage may be utilized by the emulation module 125. One known example method for determining instantaneous RMS voltage by the RMS module 123 is described below with regard to FIGS. 8-9.

Figure 5A:
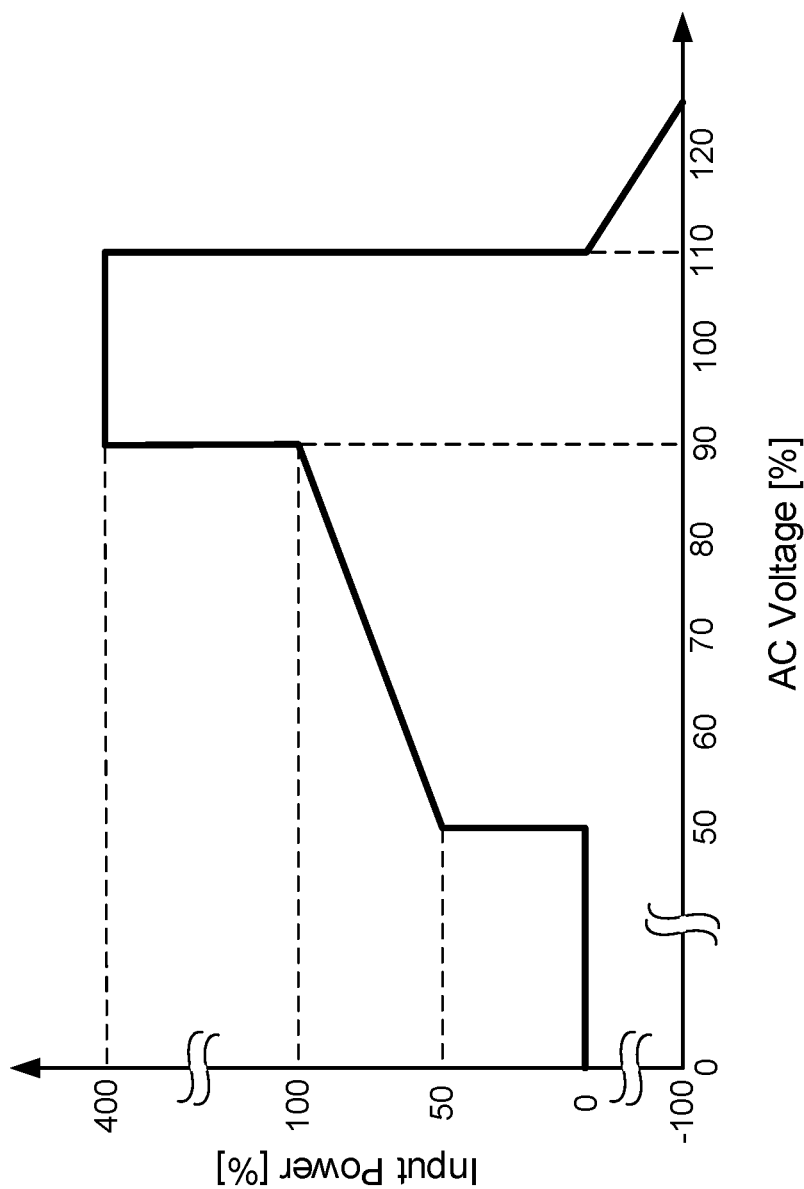
FIG. 5A is an example power model per utility AC voltage in accordance with aspects of the disclosure.

Once the instantaneous utility RMS voltage is determined, input power can be obtained from a pre-determined input power model. One example input power model 154 is shown in FIG. 5A, which illustrates an input power model per instantaneous RMS voltage. In some examples, the instantaneous RMS voltage can be obtained from RMS module 123. The instantaneous RMS voltage is shown as a percentage of a nominal voltage. In one example, the system operates under a nominal voltage, such as a nominal voltage of 120V AC utility voltage, where 120V AC may be considered 100% AC voltage on the graph. However, the AC voltage fluctuates up and down in real time. It can be assumed that when the incoming AC voltage is between 90-110%, this can be a baseline system voltage where the system operates at normal conditions and there is no need for an UPS back up power source. When the incoming AC voltage comes in below 90%, the actual rectifier output power rating is derated according to the AC voltage, which is reflected in the input power model shown in FIG. 5A. In this example, if the incoming utility AC voltage is registering at 60V AC voltage, the AC voltage is coming in at 50%. When the incoming AC voltage is less than 50%, the rectifier cannot support any output power in this example. This output power information is reflected in the input power model of FIG. 5A. In a more specific example, if output power is rated, for example, at 1 kW, then 1 kW will equal 100%. If the input AC voltage is only 50%, the input power cannot be 100%. Instead, the input power will also be at 50% according to the curve shown in FIG. 5A.

Figure 5B:
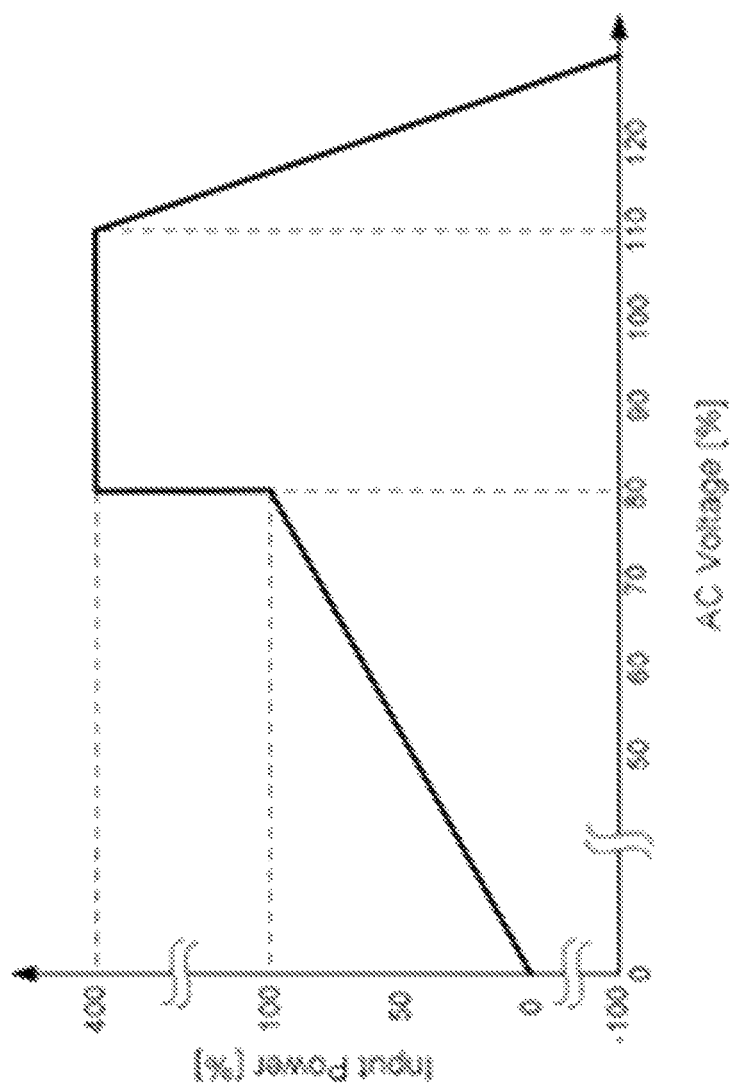
FIG. 5B is an example power model per utility AC voltage in accordance with aspects of the disclosure.

FIG. 5A is one of many example power models and can be programmed in alternative ways depending on the system requirements. FIG. 5B is similar to FIG. 5A and presents another example input power model 156 where input power can be used as a function of AC voltage (i.e., instantaneous RMS voltage). It can be assumed that when the incoming AC voltage is between 80-110%, this can be a baseline system voltage where the system operates at normal conditions and there is no need for UPS back up power source. When the incoming AC voltage comes in below 80%, the actual rectifier output power rating is derated according to the AC voltage.

If output power is rated, for example, at 1 kW, then 1 kW will equal 100%. If the input AC voltage is only 50%, the input power cannot be 100%. Instead, in the example, the input power will also be at 50% according to the curve.

Equation 2

Equation 2 determines the emulated load current $i_{LOAD}$, which is based on the relationship between the emulated output power and the emulated capacitor holdup voltage $V_{HOLDUP-EMULATED}$.

Equation 3

Equation 3 determines the emulated current $i_C$ that flows through the emulated holdup capacitor $C_{HOLDUP}$. The emulated current $i_C$ can be determined based on the difference between the emulated supply current $i_{SUPPLY}$ and the emulated current for the emulated output load $i_{LOAD}$. Equation 3 is obtained by reflecting the input AC utility current into the DC input of the emulated holdup capacitor.

The emulated current for the emulated power load $i_{LOAD}$ assumes that the load takes 100% constant power in the example where the output power of each individual rectifier is unknown. Output constant power equates to $V_{HOLDUP} \times i_{LOAD} = 100\%$.

Equation 4

Equation 4 takes into consideration the variables discussed above and also looks for $V_{INITIAL}$. $V_{INITIAL}$ is the voltage at the beginning (t=0). If t=0 is at the time of grid failure, $V_{INITIAL}$ is the fully charged voltage of the emulated holdup capacitor $C_{HOLDUP-EMULATED}$.

Figure 6:
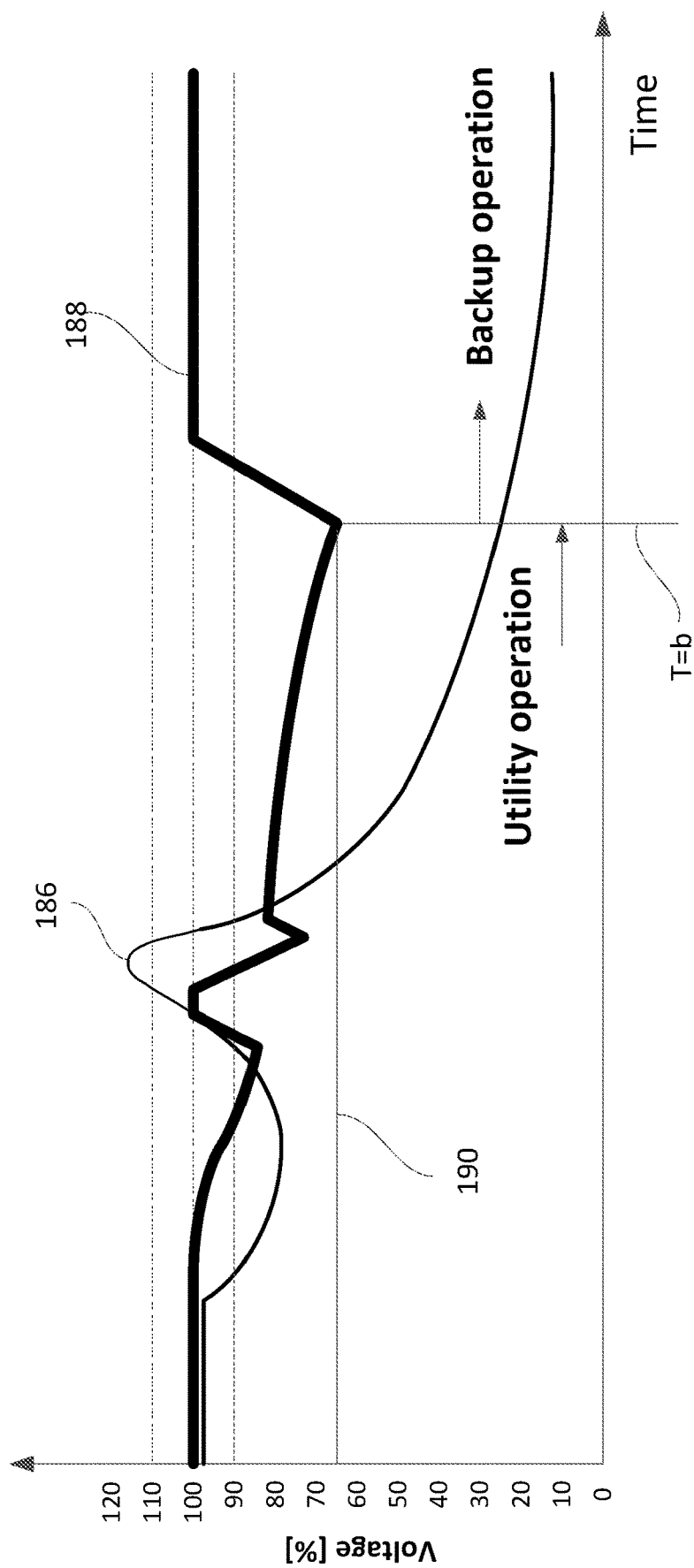
FIG. 6 illustrates an example of emulated capacitor voltage in real time, in accordance with aspects of the disclosure.

FIG. 6 illustratively depicts a timing diagram 160 showing how the circuit emulation model discussed above may operate to delay a switch to backup power in the face of any fluctuations at the AC source as shown via RMS voltage curve 186 and emulated holdup capacitor voltage 188. As discussed above, the utility RMS voltage curve 186 can be determined by the RMS module 123 monitoring the incoming AC voltage. Modeling by the emulation module 125 can be performed to process information based on the utility RMS voltage and then determine the emulated capacitor holdup voltage over time.

The threshold voltage for the emulated capacitor voltage of the emulated holdup capacitor is represented by voltage threshold line 190 and may be pre-determined based on various factors. For example, as shown, the threshold voltage for the emulated holdup capacitor can be pre-determined at 65% of a fully charged capacitor voltage. At T=b, the emulated capacitor holdup voltage curve 188 is shown just below the threshold line 190. Once this occurs, it is assumed that the actual rectifiers in the power delivery system 100 can no longer supplement the load and the primary system will be transferred to the UPS backup system.

As indicated in FIG. 6, by having a model that can accurately emulate capacitor holdup voltage, as shown via curve 188, the onset of a switch to the backup system may be delayed as long as possible. In some examples, the emulated capacitor holdup voltage is a real-time emulated capacitor holdup voltage. In the example where FIG. 5A is used as the input power model and the rectifier output power is at 100%, when the AC voltage is normal (i.e., 90-110%), the emulated capacitor is quickly charged up, but the voltage cannot exceed 100%. If the AC voltage is less than 90%, the emulated capacitor is discharged according to the input power model. If the AC voltage is greater than 110%, the emulated capacitor voltage is also dropping rapidly.

In some examples, the transfer depicted at time t=b may be executed earlier or later (e.g., one half AC line cycle or approximately 10 ms earlier or later) from the transfer timing determined via the capacitor emulation model. This may be useful to mitigate against constraints that may occur based on the type of semiconductor technology used in the system.

Example Methods

With reference back to FIGS. 1A-1B, operation of the UPS 120 is controlled by the state timing control system 124. The RMS module 123 of the state timing control system 124 monitors the incoming utility AC voltage and determines the instantaneous RMS utility voltage. The emulation module 125 can determine whether the power delivery system 100 is providing power for the load based on an input power model, such as the input power model of FIG. 5A or FIG. 5B, or whether there is an input power deficiency and operating below the baseline utility AC voltage. While the emulated holdup capacitor voltage, as reflected by the instantaneous RMS utility voltage, is maintained above the pre-determined baseline system voltage and no power abnormalities are indicated, the bypass switch 122 remains closed. The emulation module 125 of the state timing control system 124 can run modeling to determine when and whether to turn off the bypass switch 122 and open the switch 122 to transfer the primary system to an UPS backup DC power source. In particular, according to one example, the emulation module 125 of the state timing control system 124 can emulate a holdup capacitor of a worst-case rectifier to determine the emulated holdup voltage $V_{HOLDUP-EMU-LATED}$.

Based on this information, the instantaneous RMS utility voltage can be determined. In one example, the RMS module 123 can determine instantaneous RMS voltage and communicate with the state timing control system 124. In some examples, the emulation module 125 may plot the RMS utility voltage onto a chart where RMS utility voltage is on the vertical axis and time is on the horizontal axis, as shown in the chart 160 of FIG. 6. In an alternative example, the RMS module 123 can plot the RMS utility voltage versus time chart and provide this information to the emulation module 125. In still another example, the emulation module can determine the instantaneous RMS utility voltage.

Based on a comparison between the emulated capacitor holdup voltage and its threshold voltage, the switch 122 can be turned off. In one example, when the emulated holdup voltage reaches the threshold voltage level shown at line 190, the state timing control system 124 can communicate with the switch 122 and turn the switch off or open the switch. This will transfer the system to the backup power source 128. In other examples, the bypass switch may be turned off when the emulated capacitor holdup voltage is equal to or less than the threshold voltage. In still other examples, the bypass switch may be turned off when the emulated capacitor holdup voltage approaches the threshold voltage or a slightly before the emulated capacitor holdup voltage is at or below the threshold voltage.

It is to be appreciated that to accommodate any constraints of the technology, the transfer to the UPS system can occur at any desired timing based on the emulated capacitor holdup voltage. For example, the transfer can be executed slightly earlier or slightly later than when it is determined that a transfer to the UPS should occur. For example, the transfer can occur at a half AC line cycle about 10 msec, or from −10 msec to +10 msec from the calculated timing.

Figure 7A:
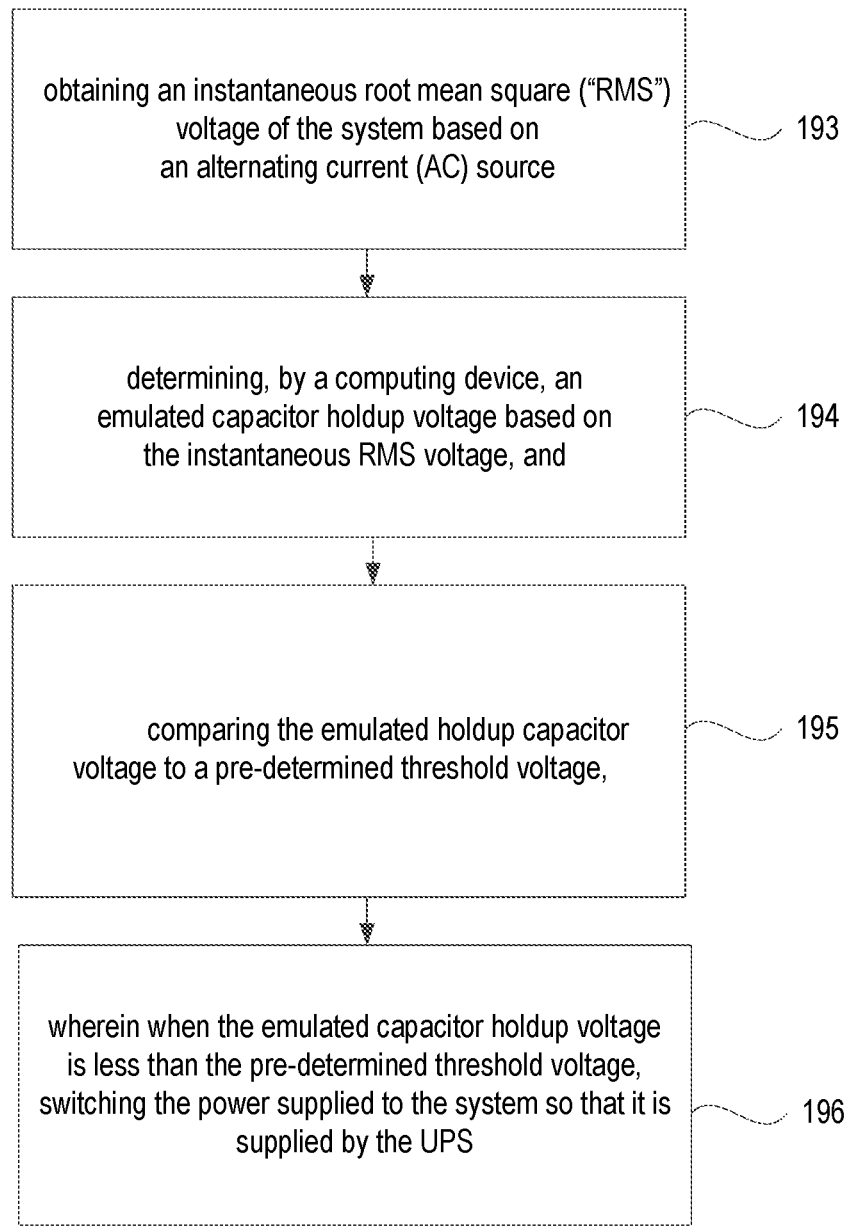
FIG. 7A is an example flow diagram for determining when to transition to an UPS in accordance with aspects of the disclosure.

FIG. 7A is a flow diagram 192 providing a method for determining when to turn off a bypass switch of an UPS of a system. Operation of the UPS 120 is controlled by the state timing control system 124.

At block 193, an RMS voltage is obtained based on an AC voltage supplied by an AC source. In one example, and as discussed above, the RMS voltage may be calculated by RMS module 123. In some examples, the RMS module 123 of the state timing control system 124 monitors the incoming utility AC voltage and determines the instantaneous RMS utility voltage.

At block 194, an emulated capacitor holdup voltage based on the instantaneous RMS voltage and the rectifier output power is determined by a computing device. In one example, the emulated holdup voltage is determined according to Equation 4. The emulation module 125 can emulate the capacitor holdup voltage for each of the three phases of incoming AC voltage, and then select the worst-case voltage from among the three emulated holdup capacitor voltages. In some examples, the worst-case voltage may be the lowest emulated holdup capacitor voltage from three AC phases, which can be an indication, for example, that there are power fluctuations, line faults, or that reduced voltage or power is entering the system.

At block 195, the emulated holdup capacitor voltage may be compared to a pre-determined threshold voltage. In some examples, the emulation module 125 may plot the RMS utility voltage onto a chart where RMS utility voltage is on the vertical axis and time is on the horizontal axis, as shown, for example, in the chart 160 of FIG. 6. The threshold voltage for the emulated voltage is shown at line 190 as 65% of the fully charged holdup capacitor voltage in this example, but as discussed above, the threshold voltage can be set or pre-determined to be any desired voltage level.

At block 196, when the emulated capacitor holdup voltage is less than the pre-determined threshold voltage, the power supplied to the system may be switched so that it is supplied by the UPS. In some examples, the bypass switch may be turned off when the emulated capacitor holdup voltage is less than or equal to the actual threshold voltage. In still other examples, the bypass switch may be turned off when the emulated capacitor holdup voltage approaches the threshold voltage or a few milliseconds before or after the emulated capacitor holdup voltage is at or below the threshold voltage.

Figure 7B:
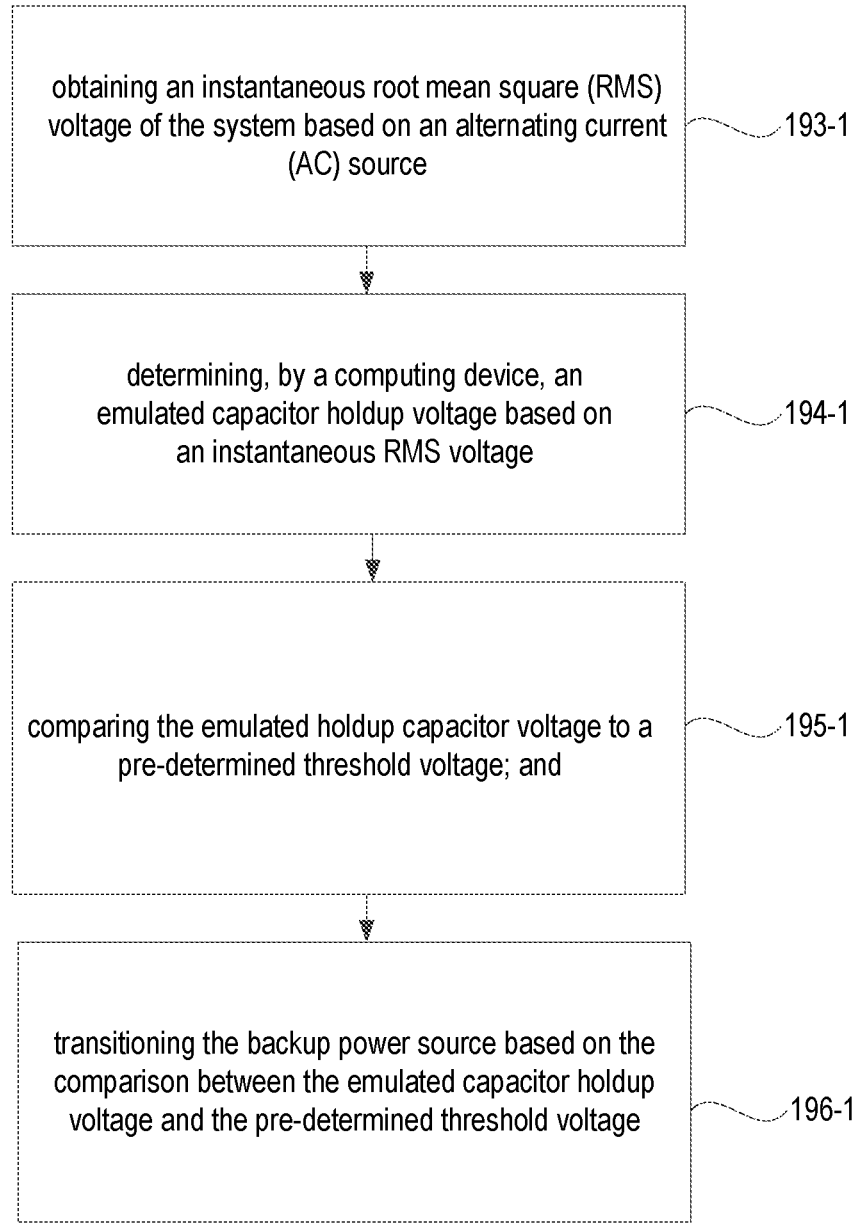
FIG. 7B is an example flow diagram for determining when to transition to an UPS in accordance with aspects of the disclosure.

FIG. 7B is another flow diagram 192-1 that provides another method for determining when to turn off a bypass switch of an UPS of a system.

At block 193-1, an RMS voltage of the system is obtained based on an AC voltage of the system, based on an AC source. In one example, and as discussed above, the RMS voltage may be calculated by RMS module 123. In some examples, the RMS module 123 of the state timing control system 124 monitors the incoming utility AC voltage and determines the instantaneous RMS utility voltage.

At block 194-1, an emulated capacitor holdup voltage based on the instantaneous RMS voltage may be determined, for example, by a computing device. In some examples, the emulated capacitor holdup voltage may be further based on an output power draw. If the output power draw is unknown due to numerous rectifiers installed and the inability to monitor the output power of all rectifiers, the worst-case output power which is the maximum 100%, can be used. In an example where incoming AC utility voltage is a three-phase voltage, the emulation module 125 can emulate the capacitor holdup voltage for each of the three phases. For instance, the emulation may comprise the worst-case actual rectifier holdup capacitor voltage out of all the rectifiers, e.g., 1000 rectifiers. In some examples, the emulated holdup capacitor voltage may be the same as the worst-case actual rectifier holdup capacitor voltage.

At block 195-1, the emulated holdup capacitor voltage is compared to a pre-determined threshold voltage.

At block 196-1, based on the comparison between the emulated capacitor holdup voltage and the threshold voltage, transitioning the backup power source based on the comparison between the emulated capacitor holdup voltage and the pre-determined threshold voltage. In some examples, the bypass switch may be opened and turned off, so as to transition the system to the UPS.

Determining Instantaneous Rms Voltage

According to aspects of the disclosure and as discussed above, the RMS module 123 can determine the instantaneous RMS voltage of the incoming AC line, when there is an instantaneous line fault or power abnormality. This information can also be used by the emulation module 125 to determine the emulated capacitor holdup voltage $V_{HOLDUP-EMULATED}$.

An example module and apparatus for determining instantaneous RMS voltage can include sensors configured to ascertain two or more alternating current voltage signals. In some aspects, a first AC voltage is sensed at a resistor branch and a second AC voltage is sensed at a resistor-capacitor branch. A processor is configured to transform the two alternating current voltage signals into two instantaneous direct current voltage values. Analysis of at least one direct current value is performed to determine whether or not the instantaneous RMS line voltage is within or outside the range of the required (or expected) RMS line voltage. If the direct current value indicates that the line voltage is outside the expected RMS voltage value, it is determined that an alternating current line fault or power abnormality has occurred or is occurring. In some examples, at all times, the RMS module 123 will communicate with the emulation module 125 and provide instantaneous RMS voltage. Based on this, the emulation module 125 will continue to determine the emulated capacitor holdup voltage $V_{HOLDUP-EMULATED}$.

Figure 8:
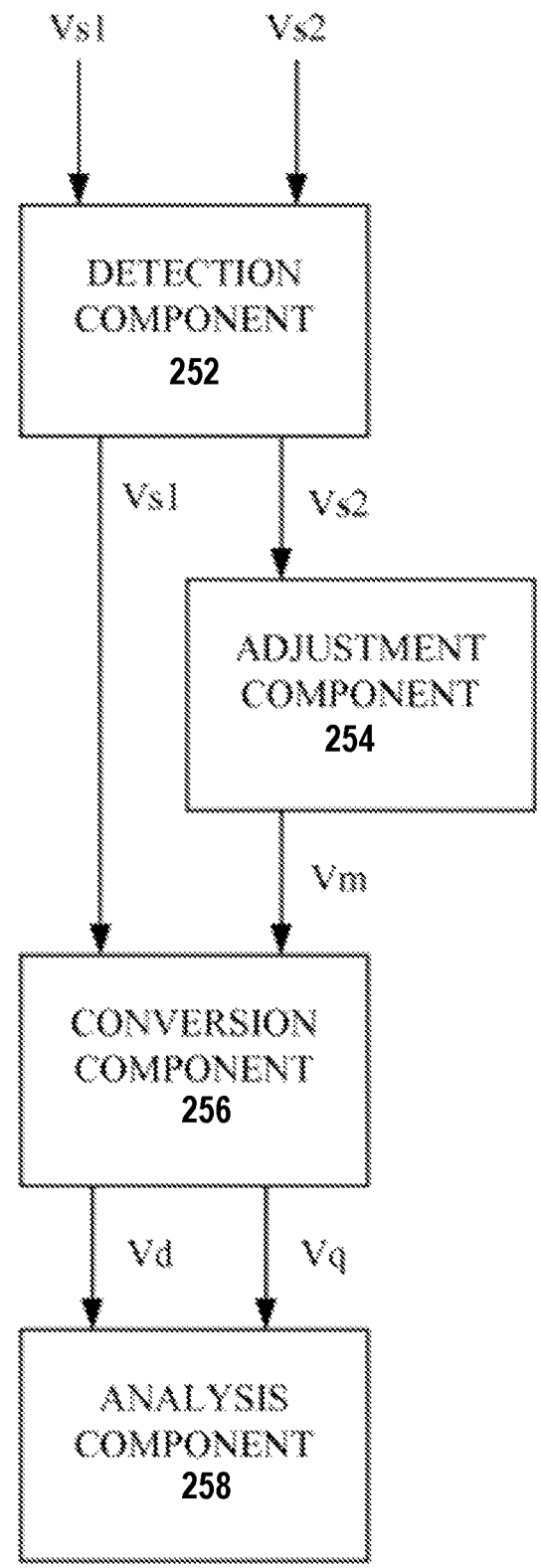
FIG. 8 is an example system configured to determine instantaneous root mean square (RMS) voltage in accordance with aspects of the disclosure.

FIG. 8 illustrates an example RMS system 250 of RMS module 123, which can be configured to determine an instantaneous RMS voltage. The instantaneous RMS voltage can be used to both determine the emulated capacitor holdup voltage, as well as indicate an AC line fault or power abnormality at about the same time as the fault or power occurs or instantaneously. In accordance with some aspects, system 250 can transform two or more sensed AC signals into the direct current (DC) domain instantaneously, or almost instantaneously.

In accordance with some aspects, RMS system 250 is configured to detect an AC line root mean square (RMS) voltage instantaneously, or almost instantaneously (e.g., in real-time). RMS is a statistical measure of the magnitude of a varying quantity. For example, RMS system 250 can be configured to detect actual RMS current in real-time by implementation of a resistor-capacitor (RC) circuit, as will be described in further detail below.

RMS system 250 includes a detection component 252 configured to sense a first AC voltage signal Vs1 and a second AC voltage signal Vs2. The first and second voltage signals Vs1 and Vs2 may be representative of input AC voltage from the AC source. In accordance with some aspects, a single detection component 252 may be utilized to sense the signals. However, in some aspects, separate detection components are utilized to sense the signals. For example, a first detection component is configured to detect the first AC voltage signal Vs1 and a second detection component is configured to detect the second AC voltage Vs2. For example, the first detection component measures the first AC signal in a resistive branch of a circuit and the second AC signal is measured in a parallel resistor-capacitor (RC) branch of the circuit. In accordance with some aspects, the detection component 252 is a voltmeter or another device configured to sense or measure voltage (e.g., a microcontroller, a potentiometer, an oscilloscope, an instrumentation amplifier, and so forth).

Figure 9:
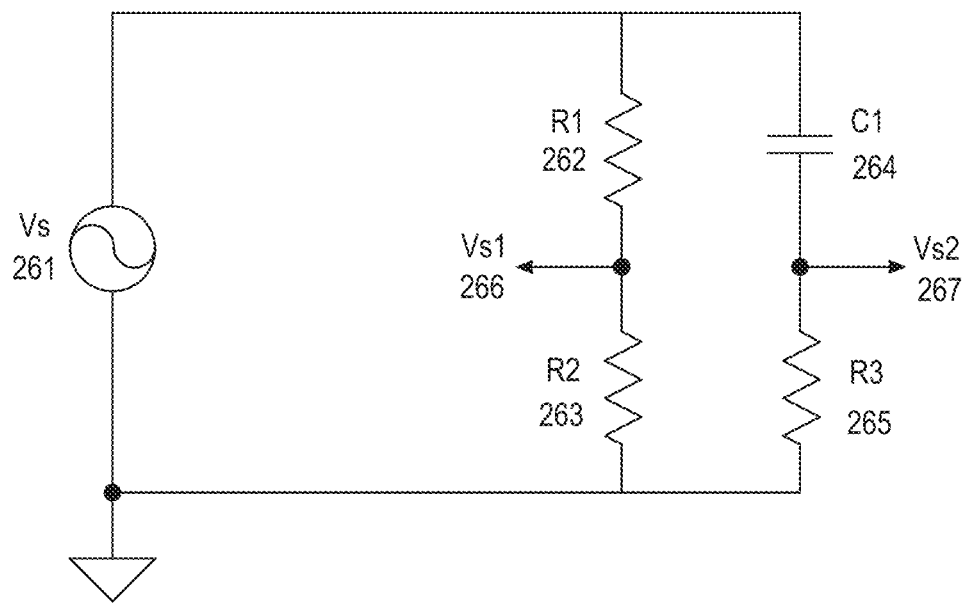
FIG. 9 is an example circuit for determining instantaneous RMS voltage.

According to some aspects, the first AC voltage signal Vs1 and the second AC voltage signal Vs2 can be sensed by detection component 252 through utilization of the circuit 260, as illustrated in FIG. 9. Included in the circuit 260 is a voltage source Vs 261. Also included in the circuit 260 are a first resistor R1 262 and a second resistor R2 263 (e.g., resistive branch) coupled in parallel with a first capacitor C1 264 and a third resistor R3 265 (e.g., resistor-capacitor branch).

The first AC voltage signal Vs1 266 is sampled or sensed, at a node, by the detection component 252 (of FIG. 8) in the resistive branch (e.g., at a first node located between the first resistor 262 and the second resistor 263). The second AC voltage signal Vs2 267 is sampled or sensed, at a node, by the detection component 252 (of FIG. 8) in the RC branch of an RC circuit 260 (e.g., at a second node located between the first capacitor 264 and the third resistor 265). In some implementations, the second AC voltage signal Vs2 267 can be about 90 degrees phase-shifted from the first AC voltage signal Vs1 266 when the circuit 260 is utilized.

As a result of being processed by an RC circuit (such as the RC circuit illustrated in FIG. 9), the second AC voltage signal Vs2 might not have the same (or substantially the same) magnitude as the magnitude of the first AC voltage signal Vs1. The difference in the magnitude of the second AC voltage signal Vs2 can be a result of the tolerance of the capacitor (e.g., first capacitor C1 264 of FIG. 9) and third resistor (e.g., third resistor R3 265 of FIG. 9).

In accordance with some aspects, the adjustment component 254 of RMS system 250 is a microcontroller and can be used in the various implementations in hardware, software, or firmware. The microcontroller can be programmable. In accordance with other aspects, the adjustment component 254 can be any device configured to modify a magnitude of the AC voltage signals.

RMS system 250 also includes a conversion component 256 configured to transform the first AC voltage signal Vs1 and the calibrated second AC voltage Vm into a first DC value Vd and a second DC value Vq. In accordance with some aspects, the first DC value represents the root mean square level of the first AC voltage signal. In some aspects, Vd is directly proportional to the required AC RMS line voltage. In an aspect, Vq can be equal to zero, or substantially equal to zero, if the two signals (Vs1 and Vm) are 90 degrees apart and the magnitude of the two signals are substantially the same.

The equations for obtaining instantaneous DC voltages Vd and Vq are as follows:

$$\begin{bmatrix} V_d \\ V_q \end{bmatrix} = T(\theta) \begin{bmatrix} V_{s1} \\ V_m \end{bmatrix} \qquad \text{Equation 5}$$

where Vs1 is the first AC voltage signal, Vm is the calibrated second voltage signal and transformation matrix $T(\theta)$ is:

$$T(\theta) = \begin{bmatrix} \sin\theta & \cos\theta \\ -\cos\theta & \sin\theta \end{bmatrix} \quad \text{Equation 6}$$

$$T(\theta)^{-1} \begin{bmatrix} \sin\theta & -\cos\theta \\ \cos\theta & \sin\theta \end{bmatrix} \quad \text{Equation 7}$$

where θ=2πf·t, where f is the AC line frequency, and where θ is determined at each zero crossing of the AC voltage. The two instantaneous DC components as a function of time t are:

$$\begin{bmatrix} V_d \\ V_q \end{bmatrix} = \begin{bmatrix} (V_{s1}\sin\theta + V_m\cos\theta) \\ (-V_{s1}\cos\theta + V_m\sin\theta) \end{bmatrix} \quad \text{Equation 8}$$

The RMS voltage is obtained by the following:

$$\text{RMS Voltage} = \begin{bmatrix} \dfrac{V_d}{\sqrt{2}} \end{bmatrix} \quad \text{Equation 9}$$

An analysis component 258 of RMS system 250 is configured to evaluate the first DC value Vd and the second DC value Vq for a line fault or other power abnormality. For example, analysis component 258 can be configured to evaluate the result of the transform, namely, the first DC value Vd and the second DC value Vq. The first DC value Vd is substantially proportional (or directly proportional) to the required AC RMS voltage. The second DC value Vq would be zero if the two signals (e.g., first AC voltage signal Vs1 and second AC voltage signal Vs2 or the calibrated second voltage signal Vm) are exactly (or substantially) 90 degrees away from each other and the magnitudes of both voltage signals are the same or substantially the same. An AC line fault is indicated from the first DC value Vd, which represents the RMS voltage of the AC line. For example, the line fault or power abnormality is indicated if the first direct current value does not correspond with a pre-determined baseline AC RMS voltage. The AC RMS voltage may be required (or desired or expected), and can be a voltage range, according to an aspect. In an example, the input AC line voltage can vary from 0 to 150 VAC. For a particular application, the power delivery system 100 can require an input utility AC line voltage (e.g., Vs in FIG. 9) of between 100 and 120 volts. In this example, the system controller (e.g., microcontroller) can be programmed so that a baseline voltage to power the system is set at 100 volts and that a fault or power abnormality exists if the RMS value of the AC line voltage is less than the baseline of 100 volts. In other words, the required RMS voltage value for the AC line must be at least 100 volts. The microcontroller can be programmed to set a baseline Vd corresponding to 100 volts RMS. In another example, the minimum required RMS voltage value for the AC line can be set at 50 volts or another RMS voltage value. A maximum limit can also be set for the required RMS voltage value, thereby creating a range of acceptable (or required) AC line RMS voltages. The AC voltage can be anything between 0 and 150 VAC or so. Based on the baseline voltage for the power delivery system 100 set for the input AC line, the controller can recognize that there is a fault or power abnormality. The RMS module 123 will continue to send data to the emulation module 125, which the emulation module 125 will use to determine when to turn off the switch 122 and open the switch to allow for the transfer from utility AC voltage to the UPS backup power source.

When the emulation module 125 of the state timing control system 124 initiates modeling to determine the emulated capacitor holdup voltage and the timing for transferring to UPS, the RMS module 123 continues to determine instantaneous RMS voltage and, in one example, can continue to determine instantaneous RMS using the above methods and systems. As the RMS system 250 continues to determine instantaneous RMS voltage, the RMS module 123 will continue to send information to the emulation module 125.

Example System

Figure 10:
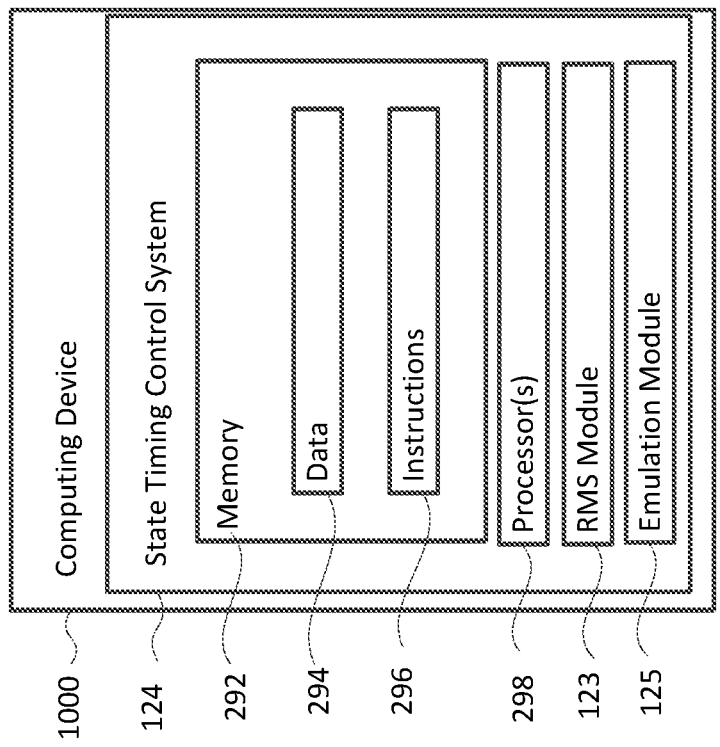
FIG. 10 is an example control system configured to control timing of switching between an AC source and backup power source in accordance with aspects of the disclosure.

FIG. 10 is a block diagram 268 illustrating an example computing device 1000, according to aspects of this disclosure. The computing device can take on a variety of configurations, such as, for example, a controller or microcontroller, a processor, or an ASIC. The computing device may further include the state timing control system 124. In some examples, as previously discussed, the state timing control system 124 may be configured to control when the bypass switch 122 should remain open and remain closed (FIG. 2) based on information from the RMS module 123 and/or the emulation module 125.

The state timing control system may include memory 292 and a processing element 298, memory 292 including data 294 and instructions 296, as well as other components typically present in server computing devices. In other examples, such operations may be performed by one or more of the computing devices in a data center or elsewhere.

The memory 292 can store information accessible by the processor 298, including instructions 296 that can be executed by the processor 298. Memory can also include data 294 that can be retrieved, manipulated, or stored by the processing element 298. The memory 292 may be a type of non-transitory computer-readable medium capable of storing information accessible by the processing element 298, such as a hard drive, solid state drive, tape drive, optical storage, memory card, ROM, RAM, DVD, CD-ROM, write-capable, and read-only memories. The processing element 298 can be a well-known processor or other lesser-known types of processors. Alternatively, the processing element 298 can be a dedicated controller such as an ASIC.

The instructions 296 can be a set of instructions executed directly, such as machine code, or indirectly, such as scripts, by the processor 298. In this regard, the terms "instructions"," "steps," and "programs" can be used interchangeably herein. The instructions 296 can be stored in object code format for direct processing by the processor 298, or other types of computer language including scripts or collections of independent source code modules that are interpreted on demand or compiled in advance. For example, the instructions 296 may include instructions for the switch 122 to close or remain open based upon modeling from the emulation module 125 and/or for the inverter 126 and backup power source 128 to become operable, as previously described herein.

The data 294 can be retrieved, stored, or modified by the processor 298 in accordance with the instructions 296. For instance, although the system and method are not limited by a particular data structure, the data 294 can be stored in computer registers, in a relational database as a table having a plurality of different fields and records, or in XML documents. The data 294 can also be formatted in a computer-readable format such as, but not limited to, binary values, ASCII, or Unicode. Moreover, the data 294 can include information sufficient to identify relevant information, such as numbers, descriptive text, proprietary codes, pointers, references to data stored in other memories including other network locations, or information that is used by a function to calculate relevant data. Data 294 can include instantaneous RMS voltage; emulated holdup voltage; or any other data that may be necessary for the state timing control system 124 to operate, including any of the modules or components within the state timing control system 124.

FIG. 10 functionally illustrates the processing element 298 and memory 292 as being within the same block, but the processor 298 and memory 292 may instead include multiple processors and memories that may or may not be stored within the same physical housing. For example, some of the instructions 296 and data 294 may be stored on a removable CD-ROM and others may be within a read-only computer chip. Some or all of the instructions and data can be stored in a location physically remote from, yet still accessible by, the processor 298. Similarly, the processor 298 can include a collection of processors, which may or may not operate in parallel.

It is to be appreciated that in this example, the RMS module 123 and the emulation module 125 are shown as part of state timing control system 124. In other examples, the RMS module 123 and/or the emulation module 125 or parts of the RMS module 123 and/or the emulation module 125 may be performed by another system. The RMS module 123 and emulation module 125 can operate as previously discussed herein, such as with regards to FIGS. 6 and 8-9

According to an aspect of the disclosure, a system comprises a switch, a rectifier, and a control element. The switch may couple a load to an alternating current (AC) source or a backup power source. The rectifier may couple the load to the AC source or the backup power source. The control element may be coupled to the switch so as to control which of the AC source or the backup power source is coupled to the load, The control element comprises an emulation module that determines when a signal should be applied to the switch such that the backup power source supplies power to the load based on a comparison of a threshold voltage to an emulated capacitor holdup voltage. The emulated capacitor holdup voltage may be determined based on a root mean square (RMS) voltage value associated with the AC source; and/or the control element receives the RMS voltage value from a RMS module; and/or the RMS module is a module of the control element; and/or the control element comprises a processing device and the RMS module and the emulation module comprise instructions stored in a memory coupled to the processing device, the instructions causing the processing device to emulate an capacitor holdup voltage of the rectifier based on a circuit model; and/or the emulated capacitor holdup voltage is based on an emulation of a capacitor associated with the circuit model; and/or the emulation module further determines the emulated capacitor holdup voltage; and/or the emulation module determines the emulated capacitor holdup voltage based on an instantaneous RMS voltage of the AC power source and an emulated holdup capacitor value associated with the rectifier; and/or the emulated holdup capacitor voltage comprises a voltage value that emulates an actual holdup capacitor voltage of the rectifier; and/or the rectifier is coupled to a highest load among a plurality of rectifiers, and wherein the emulated holdup capacitor voltage emulates a holdup capacitor voltage associated with the rectifier; and/or the emulated capacitor holdup voltage is associated with a rectifier output power of the rectifier; and/or the AC source is a three-phase AC source, and the emulation model determines the instantaneous RMS voltage for each phase of the three-phase AC source.

According to another aspect of the disclosure, a method for selecting between an alternating current (AC) source and an uninterruptible power supply (UPS) for a system, comprises obtaining an instantaneous root mean square (RMS) voltage of the system based on an alternating current (AC) source; determining, by a computing device, an emulated capacitor holdup voltage based on the instantaneous RMS voltage; and comparing the emulated holdup capacitor voltage to a pre-determined threshold voltage. The emulated capacitor holdup voltage is less than the pre-determined threshold voltage, switching the power supplied to the system so that it is supplied by the UPS; and/or the alternating current (AC) source of the system is a three-phase voltage source, and the method further comprises obtaining the instantaneous RMS voltage for each phase of the three-phase AC source; and/or the determining comprises emulating the capacitor holdup voltage based on an input power model and output power of a rectifier associated with the system; and/or the computing device comprises one of a controller and a processor; and/or the emulated capacitor holdup voltage is greater than the pre-determined threshold voltage, the AC source is selected.

A method for selecting between an alternating current (AC) source and a backup power source of an uninterruptible power supply (UPS) for a system comprises obtaining an instantaneous root mean square (RMS) voltage of the system based on an alternating current (AC) source; determining, by a computing device, an emulated capacitor holdup voltage based on an instantaneous RMS voltage; comparing the emulated holdup capacitor voltage to a pre-determined threshold voltage; and transitioning the backup power source based on the comparison between the emulated capacitor holdup voltage and the pre-determined threshold voltage; and/or the emulated capacitor holdup voltage approaches a pre-determined percentage of the pre-determined threshold voltage, transitioning the system to the backup power source; and/or the emulated capacitor holdup voltage is at or below the pre-determined threshold voltage, transitioning the system to the UPS; and/or the determining comprises emulating the capacitor holdup voltage based on an input power model and output power of a rectifier associated with the system.

Although the technology herein has been described with reference to particular examples, it is to be understood that these examples are merely illustrative of the principles and applications of the present technology. It is to be understood that the disclosure set forth herein includes all possible combinations of the particular features set forth above, whether specifically disclosed herein or not. For example, where a particular feature is disclosed in the context of a particular aspect, arrangement, configuration, or embodiment, that feature can also be used, to the extent possible, in combination with and/or in the context of other particular aspects, arrangements, configurations, and embodiments of the disclosure, and in the disclosure generally.

The invention claimed is:

1. A system comprising:
   a switch coupling a load to an alternating current (AC) source or a backup power source;
   a rectifier coupling the load to the AC source or the backup power source; and
   a control element coupled to the switch so as to control which of the AC source or the backup power source is coupled to the load, the control element comprising an emulation module that determines when a signal should be applied to the switch such that the backup power source supplies power to the load based on a comparison of a threshold voltage to an emulated capacitor holdup voltage, the emulated capacitor holdup voltage being determined based on a root mean square (RMS) voltage value associated with the AC source.

2. The system of claim 1, wherein the control element receives the RMS voltage value from an RMS module.

3. The system of claim 2, wherein the RMS module is a module of the control element.

4. The system of claim 3, wherein the control element comprises a processing device and the RMS module and the emulation module comprise instructions stored in a memory coupled to the processing device, the instructions causing the processing device to emulate a capacitor holdup voltage of the rectifier based on a circuit model.

5. The system of claim 4, wherein the emulated capacitor holdup voltage is based on an emulation of a capacitor associated with the circuit model.

6. The system of claim 1, wherein the emulation module further determines the emulated capacitor holdup voltage.

7. The system of claim 6, wherein the emulation module determines the emulated capacitor holdup voltage based on an instantaneous RMS voltage of the AC power source and an emulated holdup capacitor value associated with the rectifier.

8. The system of claim 6, wherein the emulated holdup capacitor voltage comprises a voltage value that emulates an actual holdup capacitor voltage of the rectifier.

9. The system of claim 6, wherein the rectifier is coupled to a highest load among a plurality of rectifiers, and wherein the emulated holdup capacitor voltage emulates a holdup capacitor voltage associated with the rectifier.

10. The system of claim 6, wherein the emulated capacitor holdup voltage is associated with a rectifier output power of the rectifier.

11. The system of claim 1, wherein the AC source is a three-phase AC source, and the emulation model determines the instantaneous RMS voltage for each phase of the three-phase AC source.

12. A method for selecting between an alternating current (AC) source and an uninterruptible power supply (UPS) for a system, comprising:
   obtaining an instantaneous root mean square (RMS) voltage of the system based on an alternating current (AC) source;
   determining, by a computing device, an emulated capacitor holdup voltage based on the instantaneous RMS voltage; and
   comparing the emulated holdup capacitor voltage to a pre-determined threshold voltage,
   wherein when the emulated capacitor holdup voltage is less than the pre-determined threshold voltage, switching the power supplied to the system so that it is supplied by the UPS.

13. The method of claim 12, wherein the alternating current (AC) source of the system is a three-phase voltage source, and the method further comprises obtaining the instantaneous RMS voltage for each phase of the three-phase AC source.

14. The method of claim 12, wherein the determining comprises emulating the capacitor holdup voltage based on an input power model and output power of a rectifier associated with the system.

15. The method of claim 14, wherein the computing device comprises one of a controller and a processor.

16. The method of claim 12, wherein when the emulated capacitor holdup voltage is greater than the pre-determined threshold voltage, the AC source is selected.

17. A method for selecting between an alternating current (AC) source and a backup power source of an uninterruptible power supply (UPS) for a system, comprising:
   obtaining an instantaneous root mean square (RMS) voltage of the system based on an alternating current (AC) source;
   determining, by a computing device, an emulated capacitor holdup voltage based on an instantaneous RMS voltage;
   comparing the emulated holdup capacitor voltage to a pre-determined threshold voltage; and
   transitioning the backup power source based on the comparison between the emulated capacitor holdup voltage and the pre-determined threshold voltage.

18. The method of claim 17, wherein when the emulated capacitor holdup voltage approaches a pre-determined percentage of the pre-determined threshold voltage, transitioning the system to the backup power source.

19. The method of claim 17, wherein when the emulated capacitor holdup voltage is at or below the pre-determined threshold voltage, transitioning the system to the UPS.

20. The method of claim 17, wherein the determining comprises emulating the capacitor holdup voltage based on an input power model and output power of a rectifier associated with the system.

* * * * *